(12) United States Patent
Gune et al.

(10) Patent No.: US 6,449,531 B1
(45) Date of Patent: Sep. 10, 2002

(54) SYSTEM FOR BATCHING INTEGRATED CIRCUITS IN TRAYS

(75) Inventors: Rahul V. Gune, Nonthaburi; Watcharin Pinlam, Pathumthanee; Youthachai Bupparit, Nonthaburi, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 27 days.

(21) Appl. No.: 09/648,115

(22) Filed: Aug. 25, 2000

(51) Int. Cl.[7] ................................................. G06F 7/00
(52) U.S. Cl. ............................................... 700/218
(58) Field of Search ............................ 700/213, 214, 700/215, 218, 219, 228; 414/270, 273, 404, 416.01, 935, 939

(56) References Cited

U.S. PATENT DOCUMENTS

| | | | | |
|---|---|---|---|---|
| 4,737,845 A | * | 4/1988 | Susuki et al. | 358/101 |
| 4,869,636 A | * | 9/1989 | Reid et al. | 414/331 |
| 4,980,971 A | * | 1/1991 | Bartschat et al. | 29/833 |
| 5,059,088 A | * | 10/1991 | Klein | 414/627 |
| 5,222,293 A | * | 6/1993 | Ozimek et al. | 29/833 |
| 5,350,289 A | * | 9/1994 | Azuma et al. | 414/416 |
| 5,379,514 A | * | 1/1995 | Okuda et al. | 29/833 |
| 5,473,545 A | * | 12/1995 | Schausten | 364/478 |
| 5,485,436 A | * | 1/1996 | Forget et al. | 369/36 |
| 5,657,533 A | * | 8/1997 | Fukui et al. | 29/740 |
| 5,772,387 A | * | 6/1998 | Nakamura et al. | 414/416 |
| 5,805,472 A | * | 9/1998 | Fukasawa | 364/579 |
| 5,807,066 A | * | 9/1998 | Smith | 414/802 |
| 5,957,305 A | * | 9/1999 | Takahashi | 209/573 |
| 6,019,564 A | * | 2/2000 | Kiyokawa et al. | 414/223 |
| 6,078,188 A | * | 6/2000 | Bannai et al. | 324/765 |
| 6,202,858 B1 | * | 3/2001 | Moewes | 209/936 |
| 6,259,247 B1 | * | 7/2001 | Bannai | 324/158.1 |
| 6,279,225 B1 | * | 8/2001 | Martin et al. | 29/740 |

* cited by examiner

Primary Examiner—Christopher P. Ellis
Assistant Examiner—Khoi H. Tran
(74) Attorney, Agent, or Firm—McDermott, Will & Emery

(57) ABSTRACT

A method and apparatus are provided for transferring packaged integrated circuits ("ICs") from one JEDEC standard tray to another without manual handling of the ICs. Embodiments include a pick and place system for moving ICs from a first tray to a second tray, such as x and y axis stepper motors, motor drivers and a head for picking up and placing the ICs by vacuum. The pick and place system is controlled by a processor, such as a personal computer, that receives instructions from an input device, such as a keyboard, monitor and/or mouse. A first tray of ICs to be batched and a second tray to which the ICs are to be transferred are brought to the system. The operator enters, via a user-friendly graphical display, data relating to the package to be transferred, the quantity of devices to be transferred, and the positions of the devices in the trays. The processor then controls the pick and place system to transfer the inputted quantity of devices from the first to the second tray based on the device positional information entered by the operator. Since there is no manual handling of the ICs, damage to the devices, such as bent leads, is eliminated, as is misorientation and miscounting of devices.

9 Claims, 5 Drawing Sheets

SYSTEM FOR BATCHING INTEGRATED CIRCUITS IN TRAYS

FIELD OF THE INVENTION

The present invention relates to a system for handling packaged integrated circuits. The present invention has particular applicability in transferring packaged integrated circuits from one holding tray to another.

BACKGROUND ART

Conventional packages for semiconductor devices, also known as integrated circuits ("ICs"), include JEDEC standard-sized packages such as thin small outline packages (TSOPs) having leads, or ball grid array packages (BGAs) having attached solder balls. Conventional JEDEC standard plastic trays having an array of pockets for holding the devices, such as an 8×12 array of ICs, are typically employed to facilitate in-process handling of packaged ICs.

A lot or lots of packaged devices typically need to be "batched" at one or more processing steps; that is, transferred from one JEDEC standard handling tray to another. For example, packaged ICs are electrically tested after assembly. At the testing stage, a large lot of packaged devices may need to be split into two or more groups of trays, or several small tots may need to be combined into one large lot to reduce the number of partially filled trays. Packaged devices may also need to be batched after testing prior to marking, at a lead inspection sampling procedure (depending on yield and package type), and/or at shipping (depending on customer demand).

Anywhere devices need to be transferred from one tray to another, current techniques require manual transfer of ICs using, for example, a vacuum pen to pick up and place each device. This manual method is time consuming and prone to human error. Defects such as bent and non-coplanar leads, as well as incorrect device orientation, tend to be introduced. Moreover, devices can be miscounted or mixed together.

There exists a need for an apparatus and method for fast, error-free batching of ICs, thereby reducing manufacturing costs and increasing production throughput.

SUMMARY OF THE INVENTION

An advantage of the present invention is a method and apparatus for batching ICs that prevents damages to the devices, miscounting of devices and incorrect orientation of the devices.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by an apparatus for transferring articles from a first container to a second container, the apparatus comprising a pick and place head for picking up and placing the articles; motors for moving the pick and place head; a memory for storing a first position of each of the articles in the first container; and a processor configured for controlling the motors to move the pick and place head to the stored first position of one of the articles, controlling the pick and place head to pick up the article, controlling the motors to move the pick and place head to a second position in the second container, and controlling the pick and place head to place the article at the second position.

Another aspect of the present invention is method for transferring articles from a first container to a second container, the method comprising providing a pick and place head for picking up and placing the articles, and motors for moving the pick and place head; storing a first position of each of the articles in the first container; controlling the motors to move the pick and place head to the stored first position of one of the articles; controlling the pick and place head to pick up the article; controlling the motors to move the pick and place head to a second position in the second container; and controlling the pick and place head to place the article at the second position.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for batching packaged ICs require time-consuming manual transfer of ICs from one tray to another, which introduces human error into the process, resulting in damaged leads, misoriented ICs and miscounted ICs. The present invention addresses and solves these problems stemming from conventional batching techniques, thereby reducing manufacturing costs and increasing production yield.

According to the present invention, packaged ICs are transferred from one JEDEC standard tray to another without manual handling of the ICs. A pick and place system is provided for moving ICs from a first tray to a second tray, such as x and y axis stepper motors, motor drivers and a head for picking up and placing the ICs by vacuum. The pick and place system is controlled by a processor, such as a personal computer, that receives instructions from an input device, such as a keyboard, monitor and/or mouse. A first tray of ICs to be batched and a second tray to which the ICs are to be transferred are brought to the system. The operator enters, via a user-friendly graphical display, the type of package to be transferred, the quantity of devices to be transferred, the positions of the devices in the first tray, and the positions of devices in the second tray (if any). The processor then controls the pick and place system to transfer the inputted quantity of devices from the first to the second tray based on the device positional information entered by the operator. Since there is no manual handling of the ICs, damage to the devices, such as bent leads, is eliminated, as is misorientation of devices. Furthermore, since the quantity of devices to be transferred is set before the operation begins, miscounting is eliminated. Thus, the present invention enables error-free batching, thereby increasing yield and reducing manufacturing costs.

Figure 1:
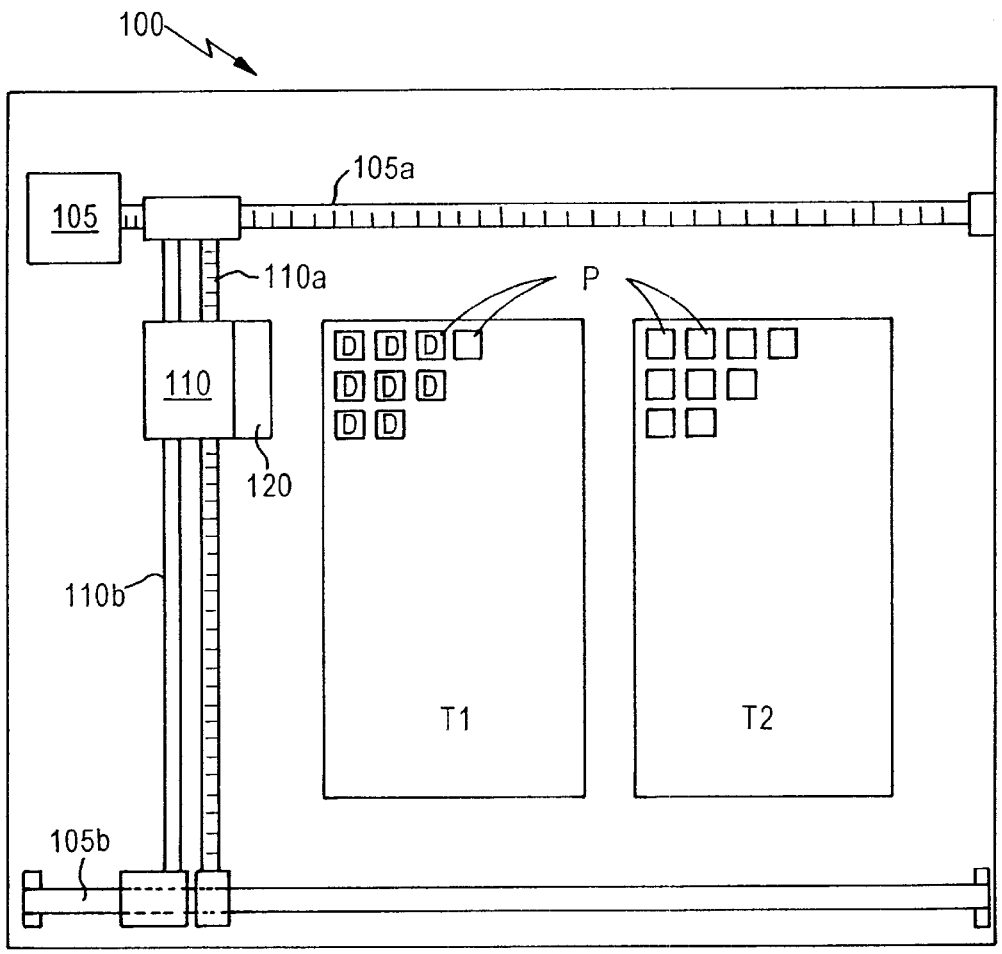
FIG. 1 schematically illustrates an apparatus in accordance with an embodiment of the present invention.

An embodiment of the present invention will now be described with reference to FIGS. 1–4. As shown in FIG. 1, an apparatus according to the present invention comprises a pick and place system 100 having a pair of conventional stepper motors 105, 110, such as Model OS22A motors, available from Parker Hannifin Corp. of California, which operate conventional rotating screws 105a, 110a and cooperate with slides 105b, 110b to move a pick and place head 120 to any desired position above trays T1, T2. Each tray T1, T2 is preferably a JEDEC standard plastic tray having pockets P for holding packaged semiconductor devices D.

Figure 2:
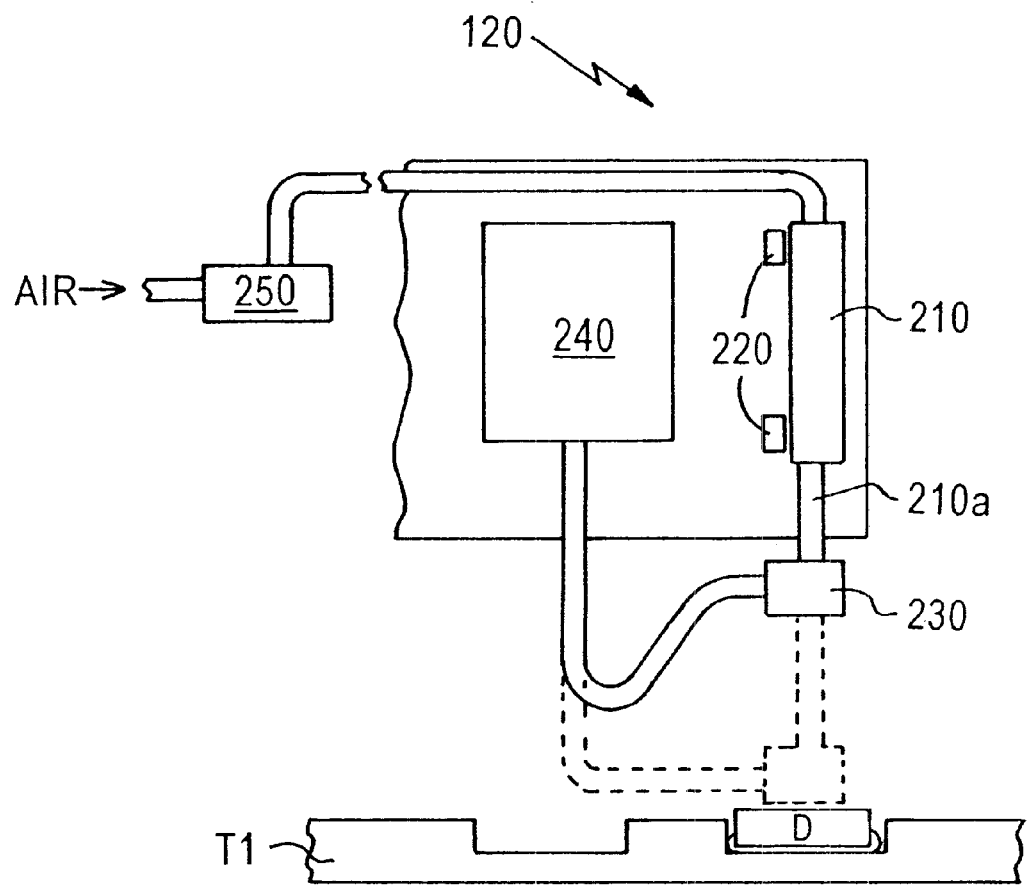
FIG. 2 is a cross-sectional view of a pick and place head according to an embodiment of the present invention.

Referring now to FIG. 2, pick and place head 120 comprises a conventional pneumatic cylinder 210, such as a Model CDU1O-25D cylinder available from SMC of Japan with conventional upper and lower limit switches 220 positioned near the top and bottom. A vacuum head 230 is attached to the plunger 210a of cylinder 210 for picking up semiconductor devices D, and a conventional vacuum generator, such as a Model VBH07 vacuum generator available from PISCO Inc. of the USA provides vacuum to vacuum nozzle 230. A conventional solenoid valve 250, such as a Model VZS120 solenoid valve available from SMC of Japan, controls compressed air flow to operate cylinder 210.

Figure 3:
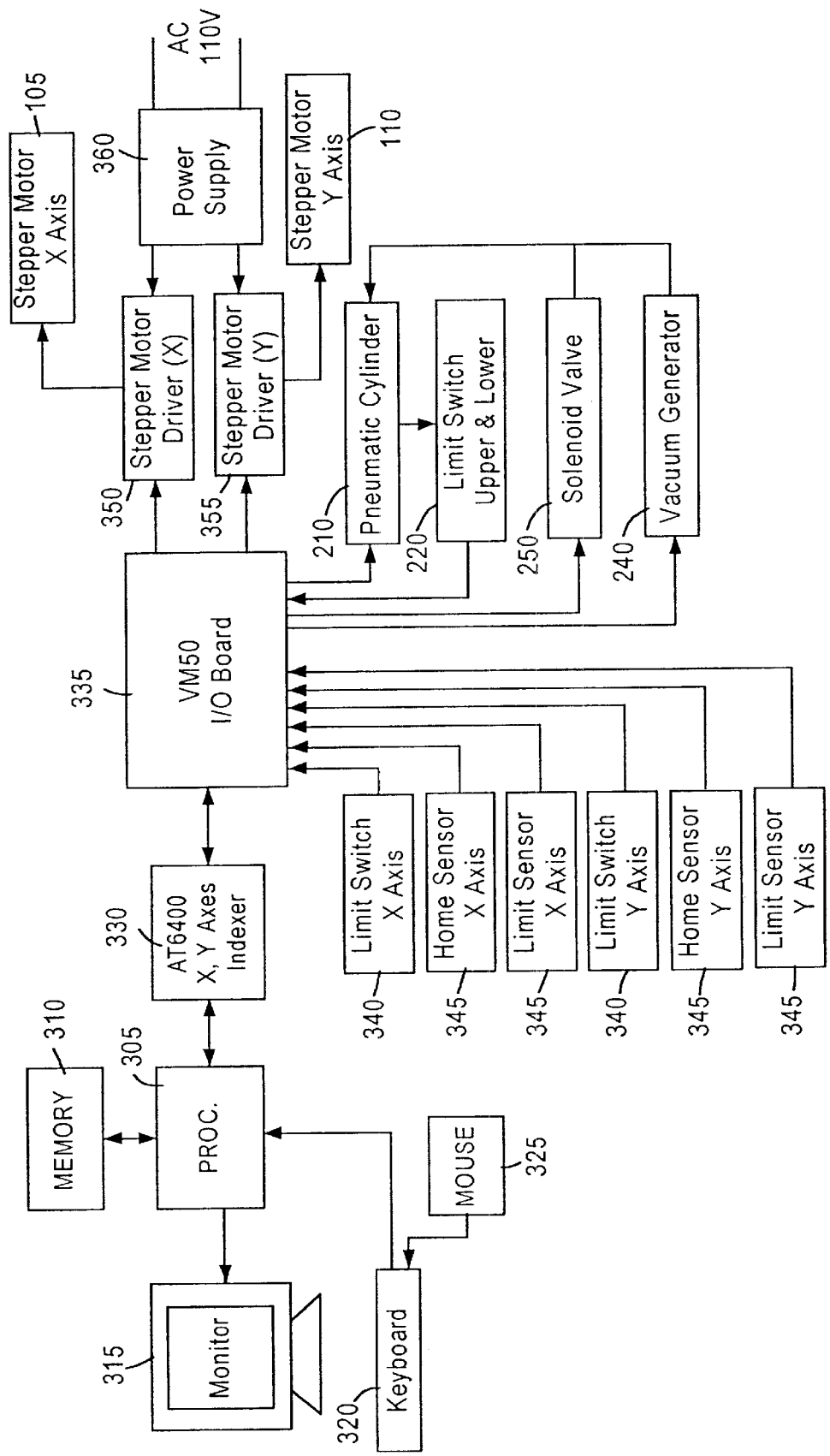
FIG. 3 is a block diagram of an apparatus according to an embodiment of the present invention.

As shown in the block diagram FIG. 3, a processor 305 is provided, which preferably performs the operations described herein electronically. A memory device 310 is also provided, such as a semiconductor memory. Processor 305 and memory 310 can be part of a personal computer, such as Model K6 450111 Microprocessor, available from Advanced Micro Devices of California. Processor 305 and memory 310 preferably are capable of running a software program that will provide a graphical user interface, such as Microsoft Visual Basic, Version 6.0. Processor 305 is connected to a monitor 315 and to input devices such as a keyboard 320 and a mouse 325, as well as to an interface card 330, such as an AT6400 available from Parker Hannifin Corp. of California, and an input/output board ("I/O board") 335, such as a VM50 available from Parker Hannifin Corp. of California. Pneumatic clyinder 210, limit switches 220, vacuum generator 240 and solenoid valve 250 are all connected to processor 330 via I/O board 335 and interface card 330, along with several conventional limit switches 340 and sensors 345 which are used, for example, when setting up pick and place system 100 and as safety stops for motors 105, 110. Additionally, a pair of stepper motor drivers 350, 355 for actuating stepper motors 105, 110, respectively, are also connected to I/O board 335. A power supply 360 for supplying power to stepper motors 105, 110 is connected to drivers 350, 355.

Figure 4A:
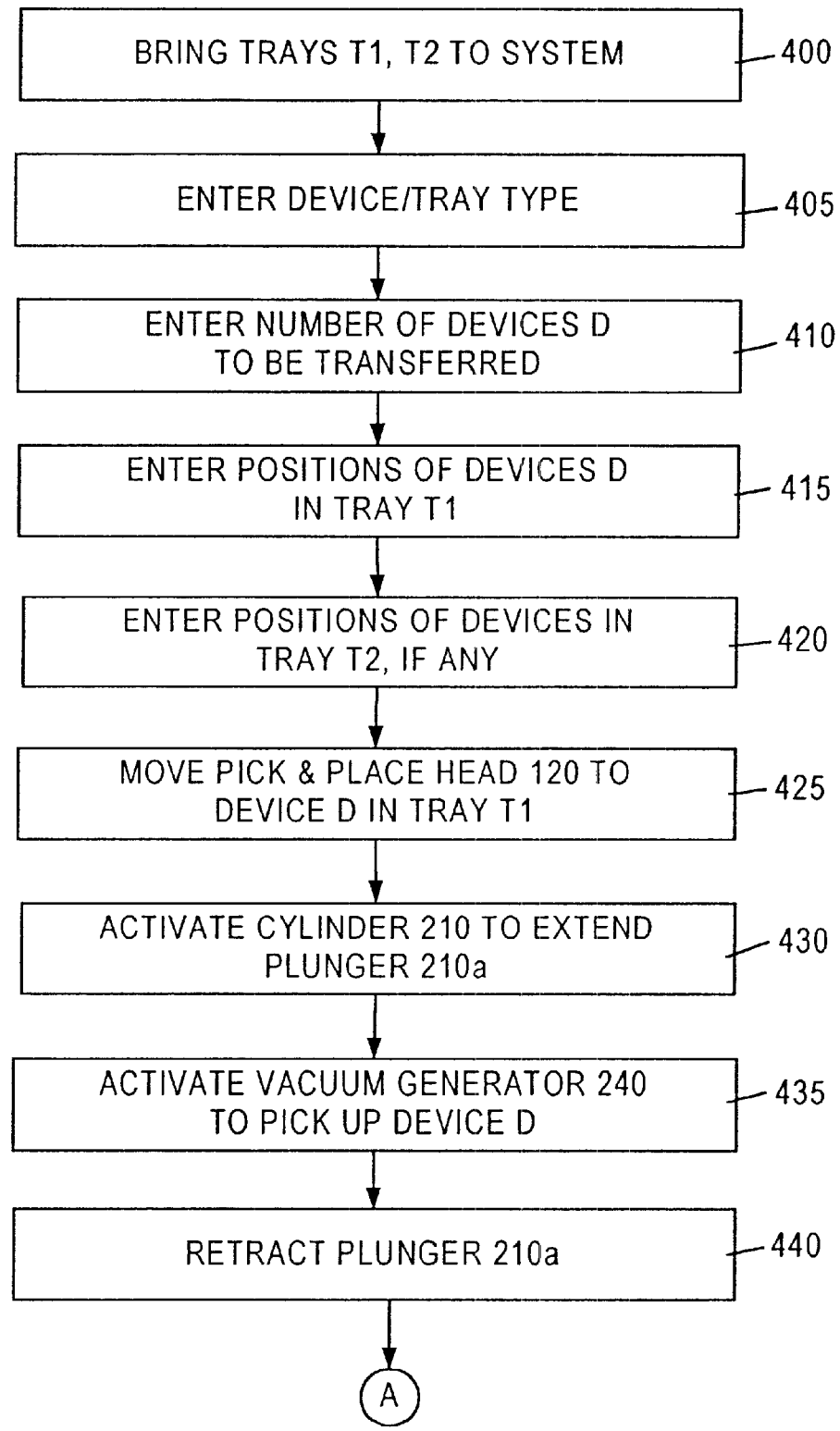
FIGS. 4A and 4B are flow charts illustrating the operation of an apparatus according to an embodiment of the present invention.
Figure 4B:
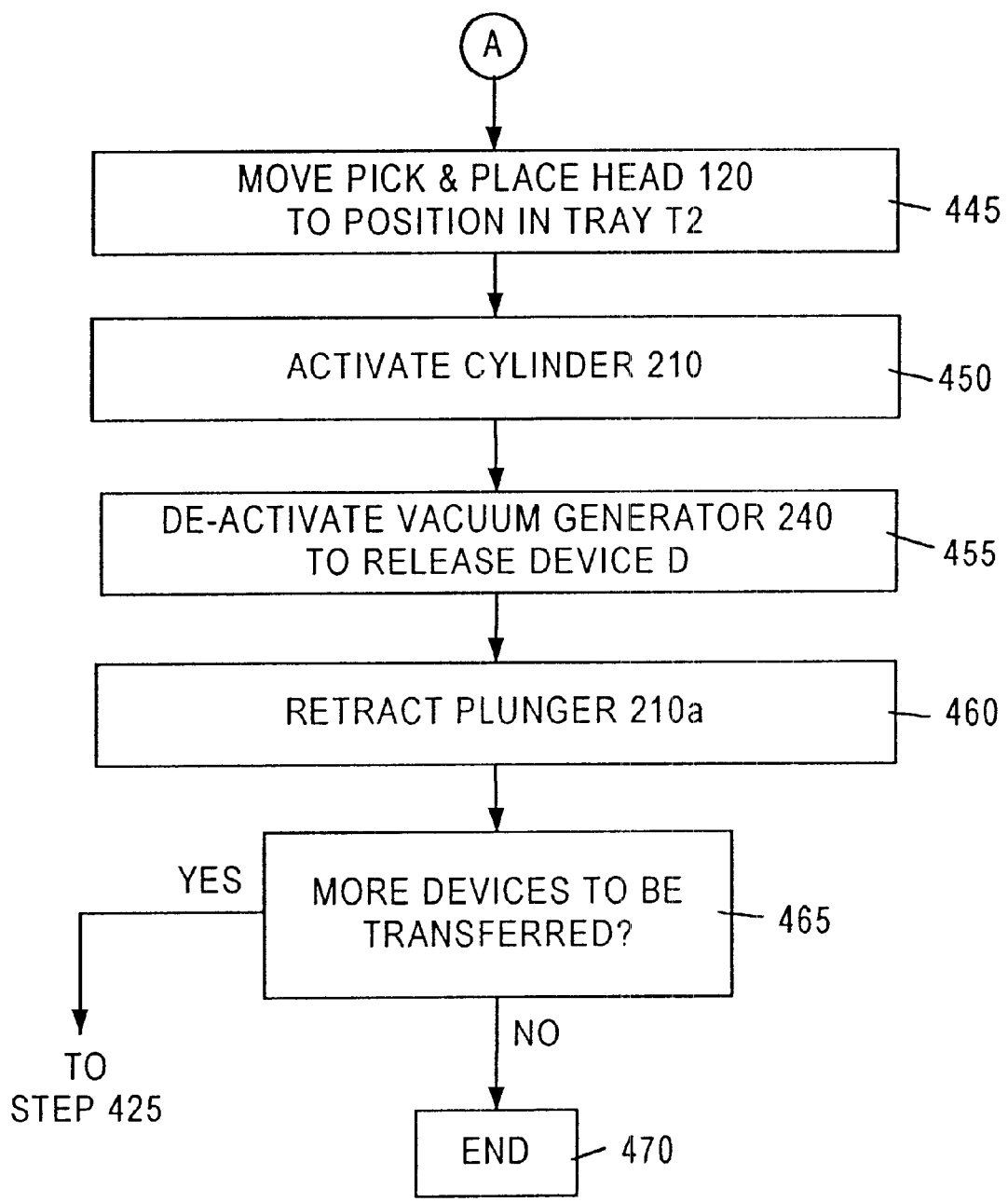

The operation of the apparatus of FIGS. 1–3 will now be described with reference to the flow charts of FIGS. 4A and 4B. Memory 310 contains databases relating to the important dimensions of different semiconductor device package types and different JEDEC standard trays used with those devices. At step 400, the operator brings trays T1 and T2 to pick and place system 100. Tray T1 has a plurality of devices D to be transferred to tray T2, which can be empty or partially filled. The operator then enters the package type of devices D to be transferred (see step 405), as by keyboard 320 or by mouse 325, preferably prompted by a user-friendly graphical display on monitor 315. The operator is also prompted to enter the number of devices D to be transferred (step 410), the positions of devices D to be transferred in tray T1 (step 415), and the positions of devices that are already be in tray T2, if any (step 420). Steps 415 and 420 are preferably carried out by the operator selecting and entering a block of pockets P displayed on monitor 315 using mouse 325 or keyboard 320. The entered information is stored, as in memory 310, for use by processor 305 to control pick and place system 100 as described below.

After the operator enters the necessary information, processor 305 controls stepping motors 105, 110 to move pick and place head 120 to a position above a device D in tray T1 to be transferred (step 425). Processor 305 then controls solenoid valve 250 to activate cylinder 210 to extend its plunger 210a until lower limit switch 220 is reached (step 430) and vacuum nozzle 230 is proximal to device D (see dotted lines in FIG. 2). Processor 305 then activates vacuum generator 240 to allow vacuum nozzle 230 to pick up device D (step 435), and controls solenoid valve 250 to retract plunger 210a of cylinder 210 (step 440).

Next, at step 445, processor 305 controls stepping motors 105, 110 to move pick and place head 120 to a position above a pocket P in tray T2 to which device D is to be transferred. The sequence of pockets P of tray T2 into which devices D are to be placed is predetermined and stored in a database, as in memory 310. The actual sequence is based on the number and placement of devices already in tray T2, if any. At step 450, processor 305 then controls solenoid valve 250 to activate cylinder 210 to extend its plunger 210a until lower limit switch 220 is reached and vacuum nozzle 230 and device D is proximal to pocket P of tray T2. Processor 305 then controls vacuum generator 240 to allow vacuum nozzle 230 to release device D (step 455), and controls solenoid valve 250 to retract plunger 210a of cylinder 210 (step 460).

Processor 305 then determines if the entered quantity of devices D has been transferred to tray T2 (see step 465). If so, the process ends at step 470. If more devices D are to be transferred, steps 425 to 465 are repeated until the appropriate number of devices D have been transferred.

Thus, the present invention eliminates manual handling of packaged ICs to be transferred from one tray to another. Since there is no manual handling of the ICs, damage to the devices, such as bent leads and non-coplanarity of leads, is eliminated. Moreover, misorientation of the ICs is avoided. Furthermore, since the quantity of devices to be transferred is set before the operation begins, miscounting is eliminated. The present invention enables error-free batching of ICs at a faster rate than conventional manual methods, thereby increasing yield while decreasing cycle time for IC transfers, and reducing manufacturing costs.

The present invention is applicable to the handling of various types of packaged semiconductor devices requiring tray-to-tray transfer.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An apparatus for transferring articles from a first container to a second container, the apparatus comprising:
   a pick and place head for picking up and placing the articles;
   motors for moving the pick and place head;
   a memory for storing a first position of each of the articles in the first container; and
   a processor configured for:
      controlling the motors to move the pick and place head to the stored first position of one of the articles,
      controlling the pick and place head to pick up the article,
      controlling the motors to move the pick and place head to a second position in the second container, and
      controlling the pick and place head to place the article at the second position;
   wherein the articles comprise packaged semiconductor devices, and the first and second containers comprise trays of a JEDEC-standard size compatible with the semiconductor devices;
   wherein the processor is further configured to control the motors based on dimensions of the semiconductor devices and the trays; and
   wherein the memory is for storing data relating to the dimensions of the semiconductor devices and the trays.

2. The apparatus of claim 1, further comprising an input device for entering the first position of each of the articles into the memory.

3. The apparatus of claim 2, wherein the memory is for storing a quantity of the articles to be transferred;
   wherein the input device is for entering into the memory a quantity of the articles to be transferred, and
   the processor is further configured to control the motors to consecutively transfer each of the quantity of articles to their respective second position.

4. The apparatus of claim 2, wherein the memory is for storing positions of articles previously transferred to the second container; and
   wherein the processor is further configured to control the motors based on the positions of articles previously transferred to the second container.

5. The apparatus of claim 4, wherein the input device is for entering into the memory the positions of articles previously transferred to the second container.

6. The apparatus of claim 2, wherein the input device comprises a graphical display.

7. The apparatus of claim 1, wherein the motors comprise x-axis and y-axis stepper motors.

8. The apparatus of claim 1, wherein the pick and place head comprises a vacuum generator.

9. The apparatus of claim 1, wherein the pick and place head comprises a pneumatic cylinder and a solenoid valve for actuating the cylinder.

* * * * *